(12) United States Patent
Kato

(10) Patent No.: US 7,088,433 B1
(45) Date of Patent: Aug. 8, 2006

(54) SELF REFERENCE TYPE DISTANCE MEASURING METHOD AND DISTANCE MEASURING APPARATUS USING AN OPTICAL PULSE

(75) Inventor: Masahiko Kato, Akiruno (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/375,676

(22) Filed: Aug. 17, 1999

(30) Foreign Application Priority Data

Aug. 21, 1998 (JP) ............................................ 10-235504

(51) Int. Cl.
*G01C 3/08* (2006.01)
*H03K 5/22* (2006.01)
*G01S 13/08* (2006.01)
*G04F 8/00* (2006.01)

(52) U.S. Cl. ..................... 356/5.01; 327/72; 342/135; 368/113

(58) Field of Classification Search ....... 356/5.01–5.15; 368/113; 342/135; 327/72
See application file for complete search history.

(56) References Cited

U.S. PATENT DOCUMENTS

| 4,849,644 A | * | 7/1989 | Mira et al. | |
| 5,374,860 A | * | 12/1994 | Llewellyn | ................... 327/276 |
| 5,726,742 A | | 3/1998 | Nourrcier | |
| 5,852,491 A | * | 12/1998 | Kato | ........................ 356/5.01 |

\* cited by examiner

*Primary Examiner*—Stephen C. Buczinski
(74) *Attorney, Agent, or Firm*—Frishauf, Holtz, Goodman & Chick, P.C

(57) ABSTRACT

A distance measuring apparatus measure the distance to a target by measuring the time required for an emitted beam of light to go to and return from the target. The light receiving section of the apparatus converts the received light into an electric signal. The clamp/inversion section of the apparatus clamps and inverts the output of the light receiving section. The comparing section of the apparatus compares the output of the light receiving section and the output of the clamp/inversion section. The determining section of the apparatus identifies the time of receiving the light on the basis of the outcome of the operation of the comparing section.

10 Claims, 2 Drawing Sheets

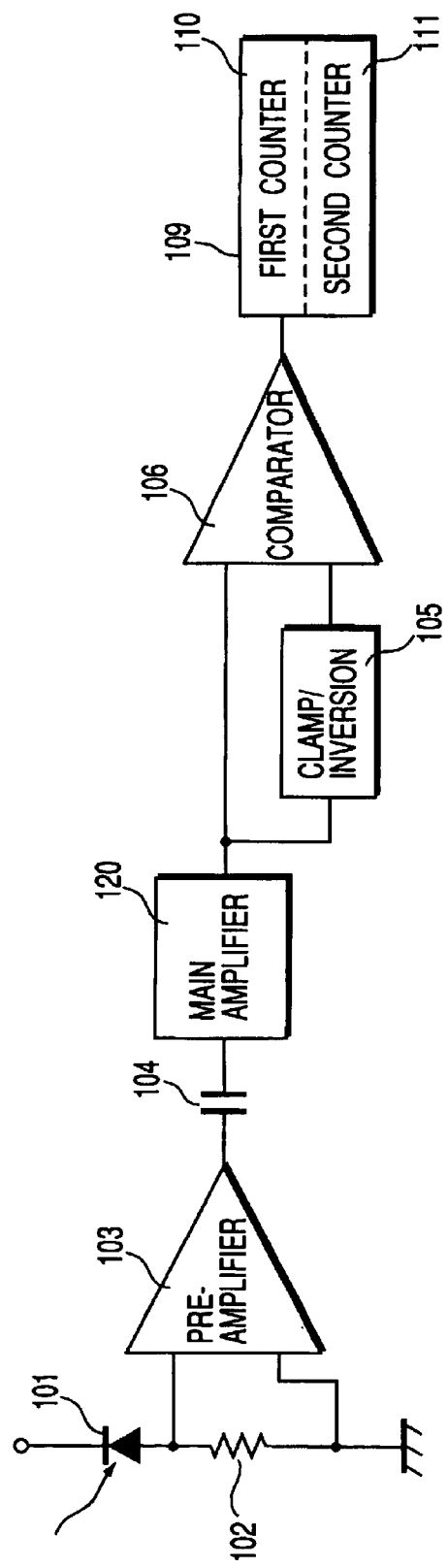
F I G. 1

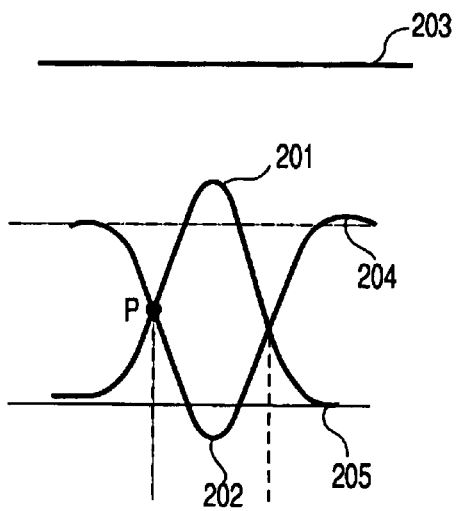
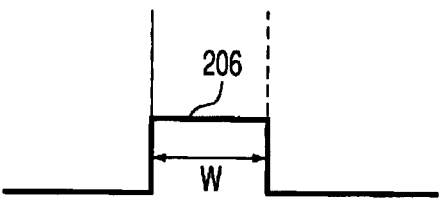
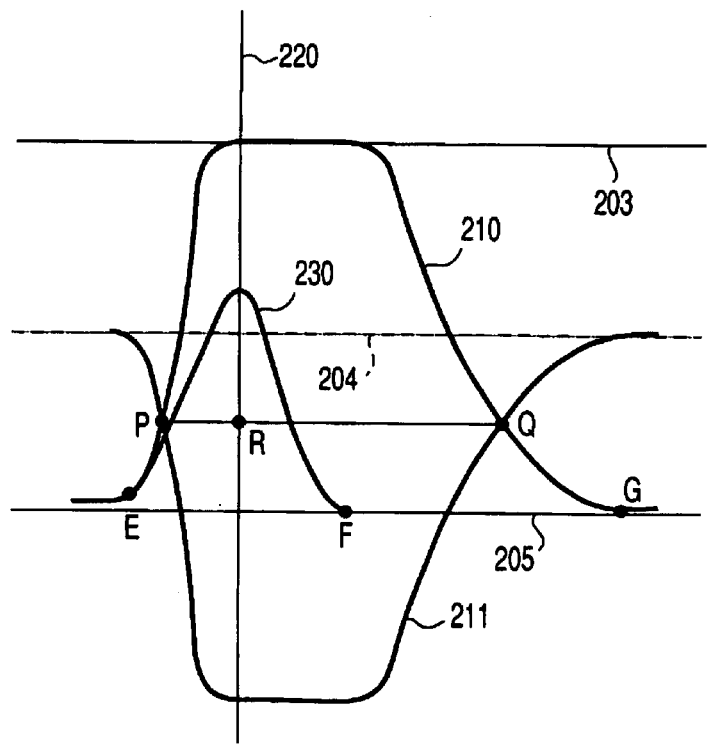
FIG. 2A
FIG. 2B
FIG. 2C
FIG. 3

SELF REFERENCE TYPE DISTANCE MEASURING METHOD AND DISTANCE MEASURING APPARATUS USING AN OPTICAL PULSE

BACKGROUND OF THE INVENTION

This invention relates to a distance measuring method and a distance measuring apparatus and, more particularly, it relates to a distance measuring method and a distance measuring apparatus for measuring the distance to a target by shooting the target with an optical pulse and measuring the time required for the optical pulse to go to and return from the target.

In the above identified technological field, there has been known methods for detecting the arrival time of a received optical pulse from a target by detecting the intersection of the received signal and a signal obtained by delaying it (referred to as self-reference type method).

U.S. Pat. No. 5,726,742 discloses such a self reference type method.

With the method of U.S. Pat. No. 5,726,742, a received signal is divided into two signals and one of them is delayed by means of a delay element. Then, the other one of the two signals is compared with the delayed signal by means of a comparator and the intersection of the two signals is used as reception signal.

However, the method of U.S. Pat. No. 5,726,742 of comparing the received signal with a delayed signal by means of a comparator is accompanied by a problem that the comparator is required to operate beyond its normal operation range particularly when the received signal shows large fluctuations of level or becomes saturated to make it no longer possible to accurately measure the distance.

On the other hand, distance measuring apparatus to be used for avoiding collisions of cars are required to observe the distance separating two cars within a range between 1m representing a high possibility of collision and at least 100 m. Then, the intensity of the received light may vary over more than 5 digits in view of possible variations in the reflectivity of the target.

The cost of processing such signals by means of an ordinary signal processing circuit without saturation will be prohibitive if technologically possible.

Additionally, the delay element that is used for delaying signals can prove itself an obstacle when an application specific integrated circuit (ASIC) is used for the signal processing circuit.

BRIEF SUMMARY OF THE INVENTION

Therefore, it is the object of the present invention to provide a distance measuring method and a distance measuring apparatus of the self reference type adapted to accurately determine the arrival time of a received optical pulse and evaluate/measure the distance to a target without relying on the amplitude of the received signal if the received signal is saturated.

According to an aspect of the invention, the above object is achieved by providing a distance measuring method for measuring the distance to a target by measuring the time required for a beam of light to go to and return from the target, the method comprising steps of:
shooting the target with a beam of light;
converting the beam returned from the target into an electric signal and generating a light reception signal;
generating an inversion signal by inverting polarity of the light reception signal and shifting relative potential level of two signals so as to make the light reception signal and the inversion signal produce an intersection;
comparing the light reception signal and the inversion signal for electric potential; and
determining the time of reception of the beam of light returning from the target based on an outcome of the potential comparison.

According to another aspect of the invention, there is provided a distance measuring apparatus for measuring the distance to a target by measuring the time required for a beam of light to go to and return from the target, the apparatus comprising:
a light reception means for converting received light into an electric signal;
a clamp/inversion means for clamping and inverting an output of the light reception means;
a comparison means for comparing the output of the light reception means and an output of the clamp/inversion means; and
a means for identifying the time of light reception based on an outcome of the comparison means.

According to still another aspect of the invention, there is also provided a distance measuring apparatus for measuring the distance to a target by measuring the time required for a beam of light to go to and return from the target, the apparatus comprising:
a light reception element for converting the received light into an electric signal and generating a light reception signal;
a clamp/inversion circuit for inverting polarity of the light reception signal generated by the light reception element, shifting the potential of the light reception signal high and generating an inversion signal intersecting the light reception signal at two points;
a comparator for comparing the light reception signal generated by the light reception element and the inversion signal generated by the clamp/inversion circuit; and
a light reception temporal point determining circuit for receiving the output of the comparator and determining the light reception temporal point between a first temporal point for inverting the magnitude relationship of the light reception signal generated by the light reception element and the inversion signal generated by the clamp/inversion circuit and a second temporal point for once again inverting the magnitude relationship thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic block diagram of an embodiment of distance measuring apparatus according to the invention.

FIGS. 2A, 2B and 2C show graphs illustrating a principal part of the waveform that can be used for the embodiment of FIG. 1.

FIG. 3 is a graph illustrating a situation where the output of the main amplifier 120 does not get to a saturation level.

DETAILED DESCRIPTION OF THE INVENTION

Reference will now be made in detail to the presently preferred embodiment of the invention as illustrated in the accompanying drawings, in which like reference characters designate like or corresponding parts throughout the several drawings.

FIG. 1 is a schematic block diagram of an embodiment of distance measuring apparatus according to the invention.

In FIG. 1, reference symbol 101 denotes a light receiving element to be used for photoelectric conversion.

Reference symbol 102 denotes a resistor connected in series to said light receiving element 101.

Reference symbol 103 denotes a pre-amplifier connected to the opposite ends of said resistor 102 for current/voltage (I-V) conversion (to be referred to as pre-amp hereinafter).

Reference symbol 104 denotes a capacitor connected to the output terminal of said pre-amp.

Reference symbol 105 denotes a clamp/inversion circuit connected to main amplifier 120.

Reference symbol 106 denotes a comparator connected to the output terminal of said main amplifier 120 and the output terminal of said clamp/inversion circuit 105.

Reference symbol 109 denotes a counter connected to the output terminal of said comparator 106.

Reference symbol 110 denotes a first counter of said counter 109.

Reference symbol 111 denotes a second counter of said counter 109.

Note that said pre-amp 103 and said main amplifier 120 constitute a signal processing circuit.

FIGS. 2A, 2B and 2C show graphs illustrating a principal part of the waveform that can be used for the embodiment of FIG. 1.

In FIGS. 2A, 2B and 2C, reference symbol 201 denotes a reception signal subjected to photoelectric conversion by said light receiving element 101.

Reference symbol 202 denotes a reception signal clamped and inverted by said comparator 106.

Reference symbol 203 denotes the saturation level of said signal processing circuit.

Reference symbol 205 denotes the 0 level of said signal processing circuit.

Reference symbol 204 denotes an intermediary level of said signal processing circuit.

Reference symbol 206 denotes an output signal of said comparator 106.

Reference symbol w denotes the pulse width of the output signal of said comparator 106.

Now, the operation of the embodiment of distance measuring apparatus according to the invention and having the above described configuration will be discussed below.

Referring to FIG. 1, a target (not shown) is hit by a beam of light emitted from a source of light emission (not shown) and the optical signal returning from the target is received by the light receiving element 101 and then converted into an electric signal by way of the resistor 102 and the pre-amp 103 for current/voltage (I-V) conversion.

It will be appreciated that the intensity of the received optical signal can vary over a wide range between about 10 nW and about 1 mW.

Therefore, the gain of the pre-amp 103 for I-V conversion is preferably selected to a level that would not saturate relative to a received optical signal with an intensity between about 10 nW and about 50 μW, even taking an arrangement of shifting stepwise the intensity of light emitted from the source of light emission relative to the intensity of the received optical signal into consideration.

After only the pulse signal is transmitted by the capacitor 104, the output of the pre-amp 103 for I-V conversion will be bisected.

One of the outputs produced by the bisection is then fed directly to the comparator 106.

The other one of the outputs produced by the bisection is fed to the clamp/inversion circuit 105 and then to the comparator 106.

Now, the operation of the clamp/inversion circuit 105 will be discussed by referring to graphs of FIGS. 2A, 2B and 2C.

Referring to the graphs of FIGS. 2A, 2B and 2C, a clamped and inverted reception signal 202 is obtained by turning upside down the reception signal 201 and clamping the 0 level 205 to an intermediary level 204.

Note that, in FIGS. 2A, 2B and 2C, the reception signal 201 does not get to the saturation level 203.

The reception signal 201 and the clamped and inverted reception signal 202 are then fed to and compared by the comparator 106 of FIG. 1.

Then, as a result, a rectangular signal 206 having its rising edge located at an intersection P of the two signals will be obtained.

Also note that the intermediary level 204 is selected in such a way that the intersection P is found within the intensity range (between about 10 nW and about 1 mW) of the received optical signal.

It may be appreciated that the intersection P will vary depending on the amplitude of the reception signal 201.

However, the middle point of the pulse width w of the rectangular signal 206 agrees with the highest point of the reception signal 201 if the latter is transversely symmetric so that the arrival time of the received optical pulse can be detected without being affected by the amplitude of the reception signal 201.

Now, the form of the reception signal 201 is basically defined by the waveform of the optical pulse of the transmitted light.

Then, when a semiconductor laser is used for the source of light emission, the waveform of the optical pulse is defined by that of the drive current of the semiconductor laser.

Generally, the waveform of the drive current is asymmetric, showing a rising side narrower than the falling side thereof.

Thus, while the middle point of the pulse width w of the rectangular signal 206 does not agree with the highest point of the reception signal 201 in the true sense of the word, they show a predetermined relationship if the drive current of the semiconductor laser operating as source of light emission shows a constant waveform.

Therefore, the arrival time of the reception signal can be accurately known on the basis of the middle point of the pulse width w of the rectangular signal 206 by utilizing the above relationship.

Now, referring to FIG. 1, the counter 109 comprises first and second counters 110, 111 as described above.

The first counter 110 is used to generate a stop signal for terminating the operation of measuring the distance at the rising edge of the rectangular pulse 206.

The second counter 111 is used to count the pulse width of the rectangular pulse 206.

With the above arrangement, the distance to the target can be evaluated and determined on the basis of the sum of the count value of the first counter obtained from the operation of measuring the distance to the target that is started when the optical pulse is transmitted and stopped at the rising edge of the rectangular pulse 206 and a half of the count value of the second counter that corresponds to the pulse width of the rectangular pulse 206.

It will be appreciated that it is not necessary to use a half of the count value (middle point of the pulse width w) of the second counter 111 and a value obtained according to a predetermined rule (e.g., $\frac{1}{2}$, $\frac{1}{3}$, . . . of the count value) may alternatively be used for the purpose of the invention.

However, the above idea is not feasible when the intensity of the received optical pulse is high and the output of the main amplifier 120 can get to the saturation level.

This will be discussed by referring to FIG. 3.

In FIG. 3, reference symbol 230 denotes a reception signal that can be obtained when there is no saturation.

Reference symbol E denotes the rising edge and reference symbol F denotes the falling edge thereof.

Straight line 220 in FIG. 3 passes the highest point of the reception signal 230 when there is no saturation.

Reference symbol G denotes the falling edge of the signal.

Reference symbol 211 denotes a signal obtained by clamping and inverting the reception signal 210 when saturated.

Points P and Q are the intersections of the two pulse waves.

Reference symbol R denotes the intersection of straight line 220 and line segment PQ.

As seen from FIG. 3, the rising edge of the saturated reception signal 210 substantially agrees with the rising edge E of the unsaturated reception signal 230, whereas the falling edge G of the saturated reception signal 210 significantly differs from the falling edge F of the unsaturated reception signal 230.

Thus, the middle point of the line segment PQ clearly does not agree with the intersection R.

This is the reason why the above idea is not feasible when the output of the main amplifier 120 gets to a saturation level.

However, a technique of approximation is available to minimize the error in such a case.

Line segment EF is about twice as long as the full width at half maximum (the full width at a half of the peak value) of the transmitted optical pulse and substantially and constantly held to that level.

Differently stated, the width of the line segment PQ does not exceed this value when the reception signal is not saturated and shows its proper wave profile.

Therefore, if the count value of the second counter 111 exceeds twice of the full width at half maximum of the transmitted optical pulse, it indicates that the reception signal is saturated.

Thus, the error can be minimized by providing an effective limit to the count value of the second counter 111 so that any value exceeding the full width at half maximum of the transmitted optical pulse may not be counted.

The term "effective limit" as used herein refers to a physical limit provided for countable values or a limit provided by means of software on the part of the CPU (not shown) that is used to read the value counted by the second counter 111.

With the above arrangement, any unduly increase of the error due to a saturated reception signal can be reduced.

For example, the intermediary level 204 may be a level slightly exceeding the noise level of the reception signal 201 (the noise level of the signal processing circuit when no optical pulse is received).

While the polarity of the received optical signal is inverted and its potential is shifted high (clamped) in the above embodiment, the present invention is by no means limited to such an arrangement and, for example, the potential of the received optical signal may alternatively be shifted down. What is essential here is that the electric potential of the received optical signal and that of the inverted signal are shifted relative to each other so that the two signals may intersect each other at two points.

While an optical pulse is popularly used for distance measuring apparatus of the type under consideration, the present invention is by no means limited thereto.

For example, it may be so arranged that a weak beam of light is normally used to shoot a target to detect only the presence or absence of a target by the presence or absence of a reflected beam and the intensity of light is raised only when actually measuring the distance to the detected target.

Therefore, according to the invention, there is provided a distance measuring method and a distance measuring apparatus of the self reference type adapted to accurately determine the arrival time of a received optical pulse and evaluate/measure the distance to a target without relying on the amplitude of the received signal if the received signal is saturated.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A distance measuring method for measuring a distance to a target by measuring a time required for a beam of light to go to and return from the target, said method comprising steps of:

shooting the target with a beam of light;

converting a beam of light returned from the target into an electric signal and generating a light reception signal;

generating an inversion signal by inverting a polarity of the light reception signal and shifting a relative potential level of said light reception signal and said inversion signal so as to make said light reception signal and said inversion signal produce an intersection;

comparing said light reception signal and said inversion signal for an electric potential; and determining a time of reception of the beam of light returned from said target based on an outcome of said potential comparison.

2. A distance measuring apparatus for measuring a distance to a target by measuring a time required for a beam of light to go to and return from the target, said apparatus comprising:

light reception means for converting a received light into an electric signal;

clamp/inversion means for clamping and inverting an output of said light reception means;

comparison means for comparing the output of said light reception means and an output of said clamp/inversion means; and means for identifying the time of light reception based on an outcome of said comparison means.

3. A distance measuring apparatus according to claim 2, wherein said means for identifying the time of light reception detects a time from a temporal point of inversion of a magnitude relationship between the output of said light reception means and the output of said clamp/inversion means and a temporal point of another inversion of a magnitude relationship and uses a predetermined value in place of the detected time when it exceeds a limit level.

4. A distance measuring apparatus for measuring a distance to a target by measuring a time required for a beam of light to go to and return from the target, said apparatus comprising:

a light reception element for converting a received light into an electric signal and generating a light reception signal;

a clamp/inversion circuit for inverting a polarity of said light reception signal generated by said light reception element, shifting a potential of said light reception signal high and generating an inversion signal intersecting said light reception signal at two points;

a comparator for comparing said light reception signal generated by said light reception element and said inversion signal generated by said clamp/inversion circuit; and a light reception temporal point determining circuit for receiving an output of said comparator and determining a light reception temporal point between a first temporal point for inverting the magnitude relationship of the light reception signal generated by said light reception element and said inversion signal generated by said clamp/inversion circuit and a second temporal point for once again inverting the magnitude relationship thereof.

5. A distance measuring apparatus according to claim 4, wherein said light reception temporal point determining circuit is provided with an upper limit value for a time between said first temporal point and said second temporal point and adapted to take a temporal point after a predetermined time from said first temporal point for a second temporal time when the upper limit value is exceeded.

6. A distance measuring apparatus according to claim 5, wherein the upper limit value of said light reception temporal point determining circuit is about twice of a half of the width of the irradiated optical pulse and said circuit is adapted to take an end of a time twice as long as a half of the width of the optical pulse from said first temporal point for the second temporal point.

7. A distance measuring apparatus according to claim 4, wherein said light reception temporal point determining circuit is adapted to select a middle point of said first temporal point and said second temporal point as the light reception temporal point.

8. A distance measuring apparatus according to claim 5, wherein said light reception temporal point determining circuit is adapted to select a middle point of said first temporal point and said second temporal point as the light reception temporal point.

9. A distance measuring apparatus for measuring a distance to a target by measuring a time required for a beam of light to go to and return from the target, said apparatus comprising:

light emission means for emitting a beam of light to the target;

light reception means for receiving a reflected light from the target and converting the light into an electric output signal;

clamp/inversion means for inverting a polarity of the electric output signal from the light reception means so as to obtain an inverted signal and clamping a predetermined potential of the inverted signal so as to make the electric output signal from the light reception means and the inverted signal intersect each other at two points;

comparison means for comparing the electric output signal from the light reception means and an output signal from the clamp/inversion means so as to detect two intersections; and means for identifying a time of light reception based on the intersections detected by the comparison means.

10. A distance measuring apparatus according to claim 9, wherein said means for identifying the time of light reception detects the time from the temporal point of inversion of the magnitude relationship between the output of said light reception means and the output of said clamp/inversion means and the temporal point of another inversion of the magnitude relationship and uses a predetermined value in place of the detected time when it exceeds a limit level.

* * * * *